United States Patent
Sass et al.

(10) Patent No.: US 8,636,528 B2
(45) Date of Patent: Jan. 28, 2014

(54) MEMORY MODULE CONNECTOR WITH LATCH ASSIST

(75) Inventors: Tony C. Sass, Fuquay Varina, NC (US);
Paul A. Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/458,347

(22) Filed: Apr. 27, 2012

(65) Prior Publication Data
US 2013/0288504 A1    Oct. 31, 2013

(51) Int. Cl.
*H01R 13/62* (2006.01)
(52) U.S. Cl.
USPC .......................................... 439/157; 439/372
(58) Field of Classification Search
USPC .................... 439/328, 157, 159, 160, 372
See application file for complete search history.

(56) References Cited

U.S. PATENT DOCUMENTS

| | | | |
|---|---|---|---|
| 4,531,795 A | 7/1985 | Sinclair | |
| 5,149,154 A | 9/1992 | Shaanan | |
| 5,413,497 A * | 5/1995 | Lwee | ............................ 439/328 |
| 5,443,394 A | 8/1995 | Billman et al. | |
| 6,132,228 A | 10/2000 | Lang | |
| 6,364,674 B1 | 4/2002 | Kajiura | |
| 6,672,904 B1 | 1/2004 | Chen | |
| 7,252,523 B1 | 8/2007 | Pennypacker et al. | |
| 7,344,402 B2 | 3/2008 | Langgood et al. | |
| 7,396,244 B1 | 7/2008 | Barna et al. | |
| 7,500,863 B2 | 3/2009 | Ringler et al. | |
| 7,645,150 B1 | 1/2010 | Chang | |
| 7,862,382 B2 | 1/2011 | Nishio et al. | |
| 7,985,087 B2 * | 7/2011 | Li et al. | .......................... 439/157 |
| 8,002,563 B2 | 8/2011 | Li et al. | |
| 8,052,448 B2 | 11/2011 | McKee | |
| 8,235,740 B2 * | 8/2012 | Tsai | .............................. 439/328 |
| 2009/0077293 A1 | 3/2009 | Kerrigan et al. | |

* cited by examiner

*Primary Examiner* — Hae Moon Hyeon
(74) *Attorney, Agent, or Firm* — Cynthia G. Seal; Jeffrey L. Streets

(57) ABSTRACT

A memory module connector includes a dynamically-assisted latch that facilitates connecting and releasing a memory module. The latch includes a lever pivotably coupled to the connector for urging the memory module into and out of a fully seated position within the connector. The lever provides a mechanical advantage for lowering and raising the memory module. A latch assist member urges the latch into engagement with the memory module in response to an insertion of the memory module, and dynamically positions the lever in response to movement of the memory module within the connector.

15 Claims, 6 Drawing Sheets

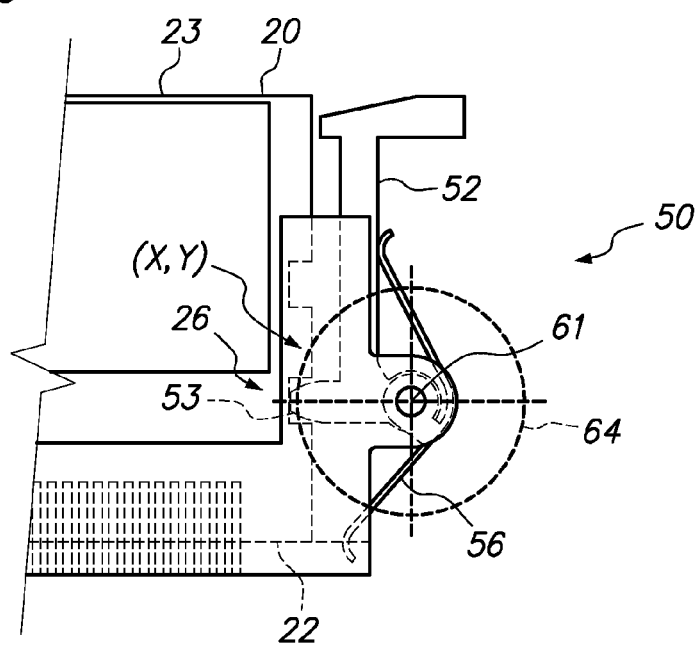

MEMORY MODULE CONNECTOR WITH LATCH ASSIST

BACKGROUND

1. Field of the Invention

The present invention relates generally to a memory system, and more particularly to memory module connectors and latching mechanisms.

2. Background of the Related Art

A memory module is a random access memory device used in a computer system. A dual in-line memory module (DIMM) is a common type of memory module having a plurality of individually addressable, dynamic random access memory (DRAM) chips mounted on a circuit board. A computer system typically has a plurality of memory module connectors, each of which receives one memory module of corresponding type. When the memory module is received into the memory module connector, contacts on the card edge interface with corresponding socket contacts. A memory controller coordinates read/write instructions from a processor to the memory modules using I/O signals addressed to specific DRAM chips. These signals are routed to the DRAM chips along the interface between the memory module contacts and socket contacts.

Memory module connectors usually include some form of extraction mechanism. Some memory module connectors include a latch for securing the memory module. The latches may be operable by hand to secure or release a memory module. Other memory module connectors are designed for use with special tools for insertion or removal of memory modules.

BRIEF SUMMARY

A memory module connector with a dynamically-assisted latch is disclosed, along with related methods of use. In one embodiment, a memory module connector comprises a connector body defining a socket for guiding movement of a memory module into and out of connection with the connector body. A latch is pivotally coupled to the connector body. The latch includes a module engagement member and a lever for pivoting the module engagement member into and out of engagement with the memory module. A latch assist member is pivotably coupled to the connector body. The latch assist member includes a lower arm extending into the socket in alignment for engagement by the memory module when the memory module is moved within the socket into connection with the connector body. An upper arm of the latch assist member pivots the latch into engagement with the memory module in response to the engagement of the lower arm by the memory module.

Another embodiment is a method for dynamically assisting the connection of a memory module with a memory module connector. In one embodiment, the method includes pivotably supporting a leaf spring on a connector body. With the leaf spring pivotably supported, a lower arm of the leaf spring is engaged with a memory module in response to an initial insertion of the memory module into a socket. A latch is automatically pivoted in response to the engaging of the lower arm of the leaf spring. The memory module is further urged into the socket with the latch by then pivoting the latch.

BRIEF DESCRIPTION OF THE SEVERAL VIEWS OF THE DRAWINGS

FIG. 6 is a diagram highlighting some preferred geometry and features of the dynamically-assisted latch 50 in the example embodiment of FIGS. 1-5.

DETAILED DESCRIPTION

Figure 1:
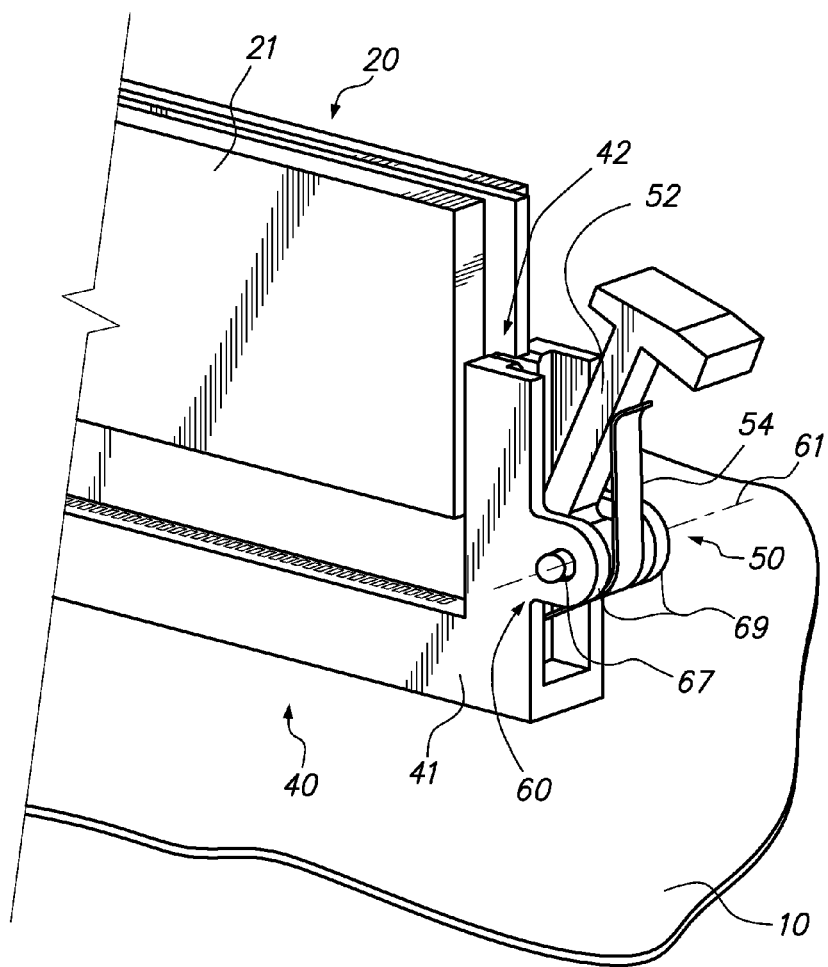
FIG. 1 is a perspective view of one end of a memory module connector having a dynamically-assisted latch.

A disclosed embodiment of a memory module connector includes a dynamically-assisted latch. The dynamically-assisted latch facilitates inserting and connecting a memory module, and subsequently disconnecting and releasing the memory module. By way of example, the memory module may be a dual in-line memory module (DIMM). However, the disclosed principles may also be applied to other types of memory modules and connectors, such as a previous-generation single in-line memory module (SIMM) or a future-developed memory module.

In one embodiment, a latch is coupled to a connector body about a pivot mechanism defining a pivot axis. The latch includes a lever movable by hand, and a memory module engagement portion for engaging a notch in the memory module in response to inward pivoting of the lever. A latch assist member is pivotably coupled to the connector body, optionally about the same pivot axis as the latch. However, the latch assist member is separately pivotable about the pivot axis, subject to any interference by the lever and/or the inserted memory module. The latch assist member may resemble a leaf spring. A lower arm of the latch assist member is engaged by an initial insertion of the memory module, causing an upper arm to engage the lever. This automatically positions the latch in response to movement of the memory module, including urging the memory module engagement portion of the lever into engagement with a notch on the memory module. Having been positioned by the latch assist member, the lever may then be operated by hand to move the memory module into and out of connection with the memory module connector.

A variety of features associated with a disclosed embodiment of the spring-assisted latch facilitate optimal functioning. As an overview of these features, the memory module engagement portion of the lever may comprise a gear tooth that interacts with a rectangular notch cutout on the side of a conventional DIMM to facilitate both inserting and extracting the memory module. The profile of the gear tooth allows it to easily engage and disengage from the notch in response to pivoting the latch. A pivot axis of the latch may be positioned just below a centerline of the notch, when the DIMM is fully-seated, to ensure the memory module is moved to the fully seated position in response to moving the latch to the closed position. A distance of the pivot axis from the memory module may be determined by an arc of travel of the gear tooth. The point at which the gear tooth engages the notch during pivoting of the latch toward the closed position is approximately the same point at which the gear tooth disengages from the notch during pivoting of the latch toward the open position. This common point of engagement and disengagement may be represented by rectangular coordinates (X,Y). For maximum mechanical advantage, the lever may be made as long as possible, preferably without exceeding the height of the memory module when the memory module and the lever are both in the closed position. The length and geometry of the latch assist member is such that the lower card edge of the memory module engages the lower arm of the latch assist member upon entry into the socket, which prevents the latch from misaligning. Curved tips of the latch assist member help prevent stubbing or snagging of the memory module. The latch assist member is formed with a sufficient spring force to overcome any friction between the latch and socket body.

FIG. 1 is a perspective view of a memory module connector 40 having a dynamically-assisted latch 50 for alternately urging a memory module 20 into and out of connection with the memory module connector 40. By way of example, the memory module 20 in this embodiment may be a DIMM, including a plurality of DRAM chips (collectively shown as DRAM 21). To simplify discussion, only one end of the memory module connector 40 and the included latch 50 are shown. An identical dynamically-assisted latch may be provided at the other end of the memory module connector 40 so that forces may be uniformly applied to both ends of the memory module 20 when urging the memory module into connection with the memory module connector 40 and when urging the memory module out of connection with the memory module connector 40. The connector body 41 defines a slot or socket 42 for receiving the memory module 20. The socket 42 guides the memory module 20 as it is moved into and out of connection with the connector 40. The memory module connector 40 is mounted to a system board 10, a portion of which is shown for reference in FIG. 1. A computer system may include a plurality of the memory module connectors 40, such as eight connectors 40 in a two-channel, four-DIMM memory configuration. The memory module connector 40 is in electronic connection with other system board components along conventional electronic pathways provided on the system board 10. For example, a processor on the system board 12 may access the memory module 20 through the memory module connector 40 for selectively reading and writing software instructions and data to the memory module 20.

The dynamically assisted latch 50 includes a lever 52 operable by hand for urging the memory module 20 into and out of connection with the memory module connector 40. The lever 52 is pivotably secured to a connector body 41 about a pivot mechanism 60. The pivot mechanism 60 may comprise a hinge, axle, pin, or other pivot member that pivotably secures the lever 52 to the connector body 41 about a pivot axis 61. The lever 52 includes a memory module engagement member, discussed further below, which engages a notch in the memory module 20. The memory module engagement member remains in engagement with the memory module 20 over a continuous range of angular position of the lever 52. A change in angular position of the lever 52 within this angular range causes a corresponding change in linear position of the memory module 20. Conversely, a change in the linear position of the memory module within the linear range causes a corresponding change in the angular position of the lever. Moving the lever 52 inwardly to a "closed" position moves the memory module 20 to a fully seated and locked position within the socket 42. Moving the lever 52 outwardly to an "open" position disconnects and releases the memory module 20 for removal from the connector 40. In FIG. 1, the lever 52 is currently positioned somewhere between the open and closed positions, with the memory module 20 inserted but not fully seated within the connector body 41.

The memory module connector 40 further includes a latch assist member 54 that facilitates angular positioning and movement of the lever 52 about the pivot mechanism 60 for properly engaging the latch 50 with the memory module 20. In this embodiment, the pivot mechanism 60 comprises a pair of semicircular flanges 69 and a pin 67 through the flanges 69 and the latch 50. The latch assist member 54 is pivotably coupled about the same pivot mechanism 60, thereby sharing the pivot axis 61. However, in another embodiment, the latch 50 and latch assist member 54 may be coupled to the connector body 41 at different pivots, having different (but parallel) pivot axis. The latch assist member 54 is responsive to movement of the memory module 20 over a linear range of position of the memory module 20 within the socket 42, to automatically position the lever 52 in response to the vertical position of the memory module 20. As an overview, in response to an initial insertion of the memory module 20 within the memory module socket 42, the latch assist member 54 urges the lever 52 inwardly from its open position into engagement with a notch on a side edge of the memory module 20. Once the lever 52 is engaged with the notch on the memory module, the lever 52 may be moved further inwardly to a closed position, wherein the movement urges the memory module 20 to the fully seated position in connection with the memory module connector 40. These and other operations are sequentially illustrated in the subsequent figures.

Figure 2:
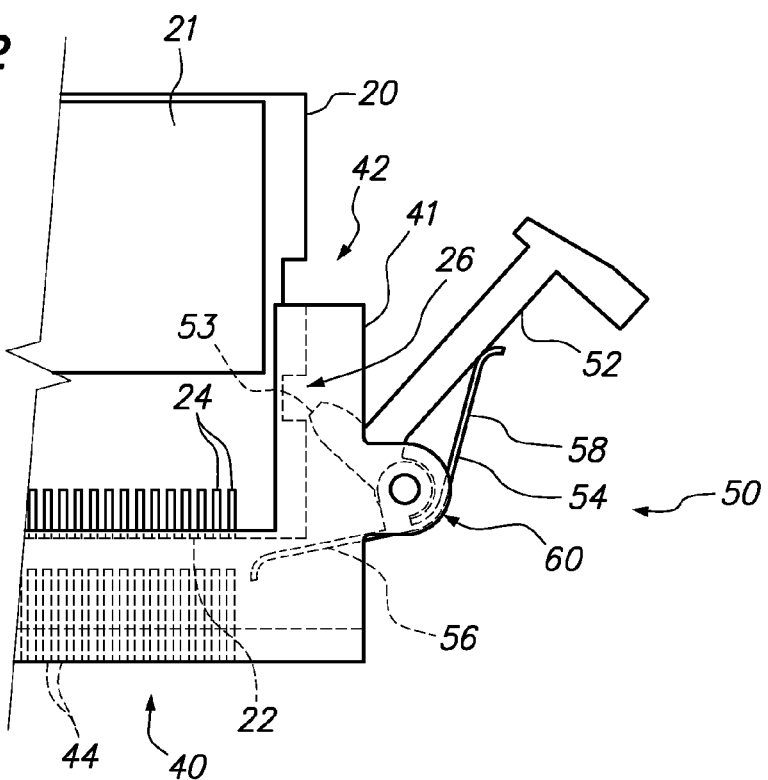
FIG. 2 is a side view of the connector of FIG. 1 upon an initial insertion of the DIMM into the socket.

FIG. 2 is a side view of the memory module connector 40 of FIG. 1 upon an initial insertion of the memory module 20 into the memory module socket 42. The latch 50 further includes a memory module engagement member 53, which may be unitarily formed with the lever 52 so that the memory module engagement member 53 pivots about the pivot mechanism 60 along with the lever 52. The memory module engagement member 53 comprises a gear tooth profile, and may be specifically referred to as gear tooth 53 in this embodiment. The lever 52 is resting in an outwardly-pivoted position, providing an initial clearance between the memory module 20 and the memory module engagement member 53 so the memory module 20 may be initially inserted into the socket 42. A card edge connector 22 at the bottom of the memory module 20 has a plurality of contacts 24 corresponding to a plurality of internal socket contacts 44. In the initially inserted position, there may be a slight separation, as shown here, between the contacts 24 on the memory module 20 and the socket contacts 44.

The latch assist member 54 includes a lower arm 56 that extends downwardly and inwardly into the socket 42 and an upper arm 58 that extends upwardly and outwardly toward the lever 52. The latch assist member 54 has a bent shape defining an obtuse angle between the upper arm 58 and the lower arm 56, with the vertex of that angle being at or near the pivot axis 61. The latch assist member 54 is free move about the pivot axis 61, subject to any interference by the lever 52 or the card edge connector 22. In the initially inserted position of FIG. 2, the card edge connector 22 is spaced slightly above the lower arm 56 and the lever 52 is in light contact with the upper arm 58. The lower arm 56 extends inwardly into the socket in alignment with the memory module 20 so that it will be engaged by the memory module 20 upon further insertion of the memory module 20 into the socket 42.

Figure 3:
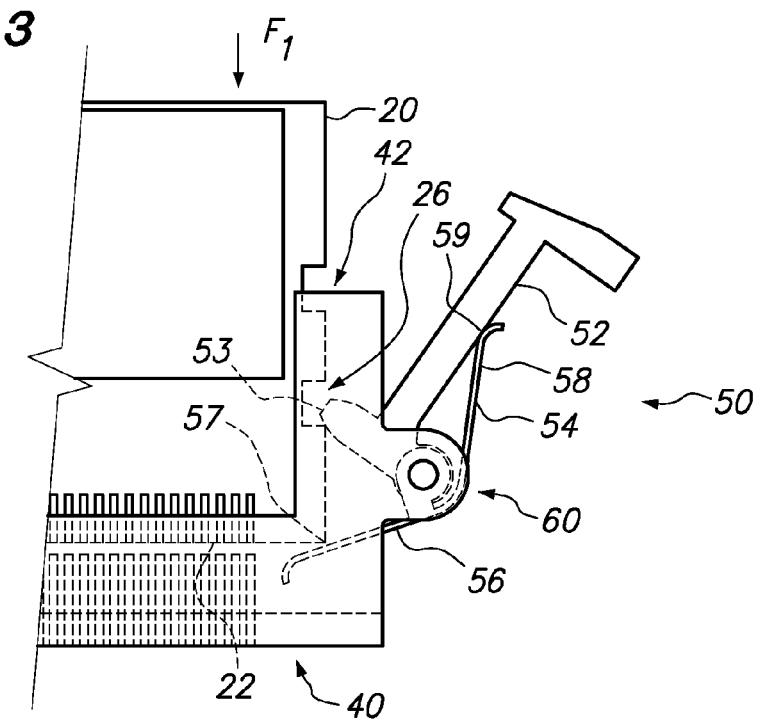
FIG. 3 is a side view of the connector, wherein the DIMM has been pushed downward into an initial engagement with a latch assist member.

FIG. 3 is a side view of the memory module connector 40, wherein the memory module 20 has been pushed downward, relative to its position in FIG. 2, into initial engagement with the lower arm 56 of the latch assist member 54. The memory module may be moved to this position without applying a force to the latch 50, by applying a downward force $F_1$ by hand to the memory module 20 itself. The memory module 20 has now been moved far enough to engage the lower arm 56 of the latch assist member 54, pivot the upper arm 58 into engagement with the lever 52, and pivot the lever 52 so that the memory module engagement member 53 engages the memory module 20. With a leading edge of the memory module engagement member 53 now slightly protruding into the notch 26, the memory module 20 may be subsequently moved further into the socket 42 by pushing the lever 52 inward.

The card edge connector 22 of the memory module 20 contacts the lower arm 56 at a first contact location 57. The lever 52 contacts the upper arm 58 at a second contact location 59. This contact with the upper arm 58 and lower arm 56 of the latch assist member 54 on opposing sides of the pivot mechanism 60 causes flexure of the latch assist member 54. The latch assist member 54 may be made of a flexible material, such as a springy plastic or steel, for accommodating the flexure. The latch assist member thereby functions as a leaf spring supported at the pivot mechanism 60, and flexed at either end in response to the forces applied to the first and second contact locations 57, 59. The latch assist member 54 is provided with a sufficient spring force to overcome any friction between the latch 50 and socket body 41 at the pivot. Curved tips of the latch assist member 54 help prevent stubbing or snagging. The first and second contact locations 57, 59 change in position relative to the position of the pivot mechanism 60 as the memory module 20 is moved within its linear range of position in the socket 42. The degree of flexure of the latch assist member 54 thus varies over this linear range of position. Initially, downward movement of the memory module 20 against the lower arm 56 of the latch assist member 54 generates a leaf spring preload for urging the module engagement member 53 of the lever 52 into engagement with the memory module 20. Generally, flexure of the latch assist member 54 may increase as the memory module 20 is further lowered into the socket 42, until the card edge connector 22 slips past the lower arm 56 (see FIG. 5).

Figure 4:
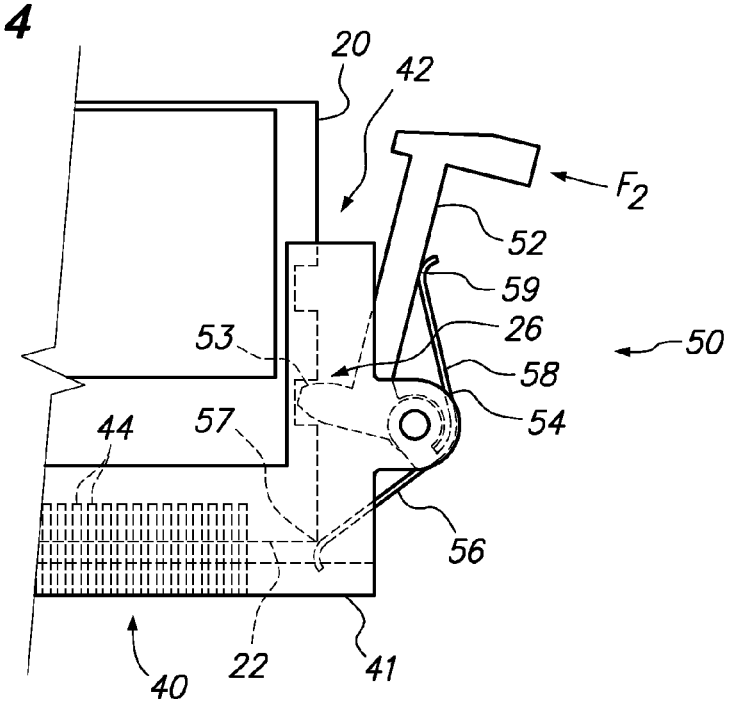
FIG. 4 is a side view of the connector, wherein the DIMM has been moved further into the socket by moving the lever inward.

FIG. 4 is a side view of the memory module connector 40, wherein the memory module 20 has been moved further into the socket 42 relative to its position in FIG. 3 by moving the lever 52 further inward. An inward force $F_2$, or any force causing rotation about the pivot axis, is applied to the lever 52 to cause the lever 52 to pivot inwardly and move the end of the memory module 20 further into the socket 42 as shown. The contacts 24 along the card edge connector 22 are now in slightly overlapping contact with the socket contacts 44. However, the memory module 20 has not reached the fully seated position, and the lever 52 needs to be moved further inward to a closed position to best secure the memory module 20 in the socket 42 and achieve fully engagement between the memory module connector 40 and memory module 20 to provide reliable electronic communication therebetween. With the memory module engagement member 53 protruding into the notch 26, moving the lever 52 further inwardly toward the closed position will urge the memory module 20 to the fully seated position.

Referring to the latch assist member 54, the first contact location 57 (between the card edge connector 22 and the lower arm 56) has moved downward along the lower arm 56 relative to the position of FIG. 3. However, because the lever 52 and latch assist member 54 both pivot around the same pivot axis, the second contact location 59 between the lever 52 and the upper arm 58 is substantially unchanged from FIG. 3 to FIG. 4. The latch assist member 54 has been further flexed as a result of the memory module 20 having been moved from its position in FIG. 3 to its position in FIG. 4. The card edge connector 22 of the memory module is on the verge of slipping past the lower arm 56.

Figure 5:
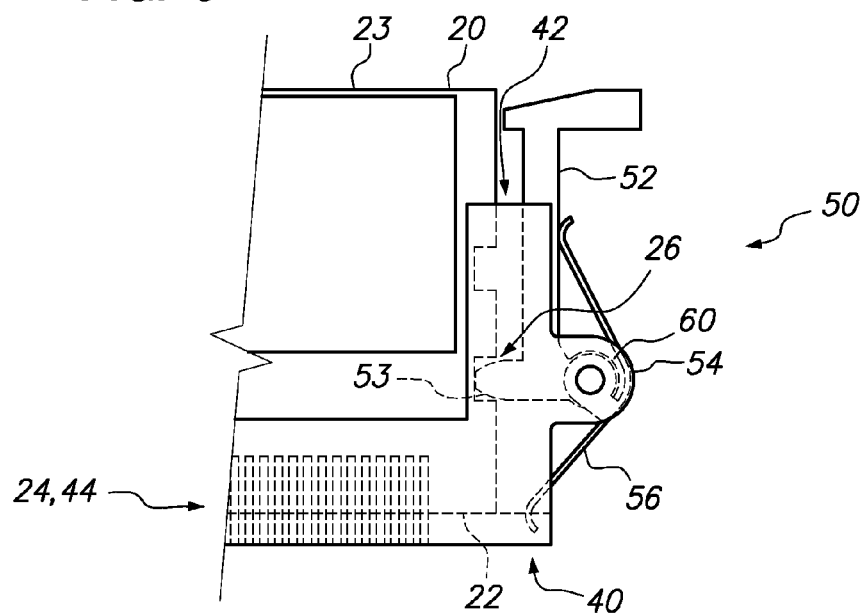
FIG. 5 is a side view of the connector, wherein the DIMM has been moved to the fully seated position by moving the lever to the closed position.

FIG. 5 is a side view of the memory module connector 40, wherein the memory module 20 has been moved to the fully seated position by moving the lever 52 to the closed position. As shown in this embodiment, the lever 52 is now vertical. To maximize mechanical advantage, the lever 52 is made as long as possible without extending above a top edge 23 of the fully seated memory module 20. The contacts 24 on the card edge connector 22 are now contacting the corresponding contact socket contacts 44 over a large portion of the surface area of the contacts 24 and socket contacts 44. The card edge connector 22 has slipped past the lower arm 56 of the latch assist member 54 (i.e. the latch assist member is rotated out of engagement with the memory module 20 when the memory module 20 is in the fully seated position). The latch assist member 54 has pivoted to a position where the lower arm 56 is pivoted away from the memory module 20. This feature whereby the card edge connector 22 slips past the lower arm 56 prior to the memory module 20 reaching the fully seated position allows the memory module 20 to be moved the rest of the way to the fully seated position without interference from the latch assist member 54. This feature also lets the latch assist member 54 remain in a relaxed, un-flexed state while the memory module 20 is in the fully seated position within the socket 54.

The above-described sequence illustrated in FIGS. 2-5 for connecting and securing the memory module 20 in the connector 40 may essentially be reversed in a process of disconnecting and removing the memory module 20 from the connector 40. As an overview, the memory module 20 is disconnected and removed from the connector 40 by moving the lever 52 on each end of the memory module connector 40 outwardly. The latch assist member 54 is automatically reset and positioned in response to removal of the memory module 20 from the socket 42. A stepwise sequence of disconnecting and releasing the memory module 20 from the memory module connector 40 is described with reference to the same set of FIGS. 2-5, taken in reverse.

Referring again to FIG. 5, the process of disconnecting the memory module 20 from the connector 40 is begun by pivoting the lever 52 outwardly, away from the connector body 41. As the lever 52 is pivoted outwardly about the pivot axis 61, the memory module engagement member 53, while still protruding into the notch 26, urges the illustrated end of the memory module 20 upwardly by pressing against the upper edge of the notch 26. The other lever on the other side (not shown) may simultaneously be moved outward so that both ends of the memory module move upwardly at the same time. As the memory module 20 is moved from the position of FIG. 5 to the position of FIG. 4, the lower arm 56 of the latch assist member is pivoted back into contact with the card edge connector 22. Further outward movement of the lever 52 from the position of FIG. 4 to the position of FIG. 3 urges the memory module 20 further upward, and pivots the latch assist member 54 in the same direction about the pivot axis 61. Further outward movement of the lever 52 back to the position of FIG. 2 fully releases the memory module 20 from the connector 40, disconnecting the contacts 24 from the socket contacts 44. With the lever 52 moved back to the position of FIG. 2, clearance between the latch assist member 53 and the memory module 20 allows the memory module 20 to then be lifted and removed from the socket 42 by hand.

FIG. 6 is a diagram highlighting some preferred geometry and features of the dynamically-assisted latch 50 in the example embodiment of FIGS. 1-5. The memory module 20 and latch 50 are positioned the same as in FIG. 5, with the memory module 20 in the fully seated position and the latch 50 in the closed position. The memory module engagement portion (i.e. the gear tooth in this embodiment) 53 travels about the pivot axis 61 along a circular path traced in the figure at reference circle 64. A radius of travel of the gear tooth 53 is selected according to a distance of the pivot axis 61 from the memory module 20, so that the gear tooth 53 protrudes into the notch 26 as shown. The gear-tooth profile, in combination with the rotation of the lever 52 about the fixed pivot axis 61, causes the memory module engagement portion 53 to interact with the rectangular notch 26 on the side of the memory module 20 in a consistent manner, to facilitate both inserting and extracting the memory module 20. In particular, the engagement portion 53 engages and disengages from the notch 26 at the same point, generally indicated at (X,Y). This common point of engagement/disengagement (X,Y) may be very near (though not exactly at) an intersection between the reference circle 64 and a side of the memory module 20. The pivot axis 61 may also be positioned just below a center of the notch 26 (when the memory module 20 is fully seated) to ensure the memory module 20 will be firmly moved to the fully seated position in response to moving the latch to the closed position.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A memory module connector, comprising:
   a connector body defining a socket for guiding movement of a memory module into and out of connection with the connector body;
   a latch pivotally coupled to the connector body, the latch including a module engagement member and a lever for pivoting the module engagement member into and out of engagement with the memory module; and
   a latch assist member pivotably coupled to the connector body, the latch assist member including a lower arm extending into the socket in alignment for engagement by the memory module when the memory module is moved within the socket into connection with the connector body, and an upper arm that pivots the latch into engagement with the memory module in response to the engagement of the lower arm by the memory module.

2. The memory module connector of claim 1, wherein the module engagement member has a gear tooth profile.

3. The memory module connector of claim 1, wherein the module engagement member is positioned to remain in engagement with a notch on the memory module over an angular range of the lever corresponding to a linear range of the memory module.

4. The memory module connector of claim 3, wherein the lower arm of the latch assist member is pivoted out of engagement by the memory module when the memory module is in a fully seated position within the connector body.

5. The memory module connector of claim 3, wherein the lower arm of the latch assist member is rotated back into engagement with the memory module in response to an outward pivoting of the latch.

6. The memory module connector of claim 3, wherein the latch is pivotally coupled to the connector body about a pivot axis positioned below a center of the notch.

7. The memory module connector of claim 1, wherein the upper and lower arms of the latch assist member comprise a leaf spring configured to flexibly accommodate movement of the lever and corresponding movement of the memory module.

8. The memory module connector of claim 7, wherein the latch assist member is further configured such that downward movement of the memory module against the lower arm of the latch assist member generates a leaf spring preload for urging the latch into engagement with the memory module.

9. The memory module connector of claim 7, wherein the leaf spring has a spring constant selected to overcome friction between the latch and connector body.

10. The memory module connector of claim 1, wherein the latch assist member and the lever are pivotably coupled about a common pivot axis.

11. The memory module connector of claim 1, wherein the memory module comprises a dual in-line memory module (DIMM) and the memory module connector comprises a DIMM connector.

12. A method, comprising:
    pivotably supporting a leaf spring on a connector body, wherein the leaf spring has a lower arm and an upper arm;
    engaging the lower arm of the leaf spring with a memory module in response to an initial insertion of the memory module into a socket;
    automatically pivoting the upper arm of the leaf spring to engage a latch and cause the latch to pivot into engagement with the memory module in response to the memory module engaging the lower arm of the leaf spring; and
    urging the memory module further into the socket with the latch in response to pivoting the latch.

13. The method of claim 12, further comprising:
    automatically releasing the lower arm of the leaf spring from the memory module in response to moving the memory module to a fully seated position within the socket.

14. The method of claim 12, further comprising:
    pivoting the lower arm back into engagement with the memory module in response to an outward pivoting of the latch.

15. The method of claim 12, further comprising:
constraining the latch and the leaf spring to pivot about the same axis during movement of the memory module from the initial insertion of the memory module to the fully seated position of the memory module.

* * * * *